(12) United States Patent
Yanwei

(10) Patent No.: US 9,951,932 B2
(45) Date of Patent: Apr. 24, 2018

(54) COMPOSITE TYPE LED CIRCUIT BOARD AND MANUFACTURING METHOD

(71) Applicant: FEIT ELECTRIC COMPANY, INC., Pico Rivera, CA (US)

(72) Inventor: Shen Yanwei, Zhejiang (CN)

(73) Assignee: FEIT ELECTRIC COMPANY, INC., Pico Rivera, CA (US)

( * ) Notice: Subject to any disclaimer, the term of this patent is extended or adjusted under 35 U.S.C. 154(b) by 78 days.

(21) Appl. No.: 15/042,264

(22) Filed: Feb. 12, 2016

(65) Prior Publication Data

US 2017/0159916 A1   Jun. 8, 2017

(30) Foreign Application Priority Data

Dec. 2, 2015 (CN) .......................... 2015 1 0874039
Dec. 2, 2015 (CN) .......................... 2015 2 0988813

(51) Int. Cl.
| | |
|---|---|
| *F21V 19/00* | (2006.01) |
| *F21V 17/10* | (2006.01) |
| *F21V 23/00* | (2015.01) |
| *F21V 29/70* | (2015.01) |
| *F21V 29/89* | (2015.01) |
| *F21Y 101/02* | (2006.01) |

(52) U.S. Cl.
CPC ........ *F21V 19/0025* (2013.01); *F21V 17/101* (2013.01); *F21V 19/005* (2013.01); *F21V 23/005* (2013.01); *F21V 29/70* (2015.01); *F21V 29/89* (2015.01); *F21Y 2101/02* (2013.01)

(58) Field of Classification Search
CPC .......... F21K 9/232; F21K 9/237; F21K 9/238; F21V 29/70; F21V 29/89; F21V 23/004; F21V 23/005; F21V 19/0025; F21V 19/005
See application file for complete search history.

(56) References Cited

U.S. PATENT DOCUMENTS

| | | | |
|---|---|---|---|
| 8,421,321 B2 | 4/2013 | Chuang | |
| 8,449,154 B2 | 5/2013 | Uemoto et al. | |
| 8,760,042 B2 | 6/2014 | Sakai et al. | |
| 9,052,104 B2 | 6/2015 | Watanabe et al. | |
| 9,175,814 B2 * | 11/2015 | Shida | F21V 29/506 |
| 9,297,501 B2 * | 3/2016 | Chou | F21K 9/238 |
| 2011/0101861 A1 | 5/2011 | Yoo | |
| 2011/0109217 A1 * | 5/2011 | Kang | F21V 29/004 313/46 |

(Continued)

FOREIGN PATENT DOCUMENTS

CN   102997102 A   3/2013

OTHER PUBLICATIONS

United States Patent and Trademark Office, Office Action for U.S. Appl. No. 15/042,246, dated Jun. 27, 2017, 18 pages, U.S.A.

*Primary Examiner* — Alan Cariaso
(74) *Attorney, Agent, or Firm* — Alston & Bird LLP

(57) ABSTRACT

Various embodiments provide a light emitting diode (LED) module. In one embodiment, the LED module comprises a circuit board; a peripheral metal board abutting and about said circuit board; an electrical insulation layer on both a first surface and a second surface of said circuit board and said peripheral metal board; electrical traces on said electrical insulation layer; and one or more LEDs mounted on said electrical traces and said electrical insulation layer over said peripheral metal board.

20 Claims, 5 Drawing Sheets

(56) References Cited

U.S. PATENT DOCUMENTS

| | | | |
|---|---|---|---|
| 2013/0063945 A1* | 3/2013 | Wu | F21V 19/045 362/249.02 |
| 2013/0200402 A1* | 8/2013 | Yang | H01L 33/64 257/88 |
| 2013/0271998 A1 | 10/2013 | Merschon et al. | |
| 2016/0348884 A1 | 12/2016 | Reier et al. | |

* cited by examiner

COMPOSITE TYPE LED CIRCUIT BOARD AND MANUFACTURING METHOD

CROSS-REFERENCE TO RELATED APPLICATIONS

This application claims priority to Chinese Patent Application No. 201520988813.6, filed Dec. 2, 2015, and Chinese Patent Application No. 201510874039.0, filed Dec. 2, 2015, the contents of both of which as are incorporated by reference herein in their entireties.

BACKGROUND

Field of Invention

The present invention relates to the field of light emitting diode (LED) lamp manufacturing, and particularly relates to a composite LED circuit board integrating the LED lamp panel and the LED drive plate as well as the manufacturing method.

Related Art

An LED is a solid-state semiconductor device that can convert electric energy into visible light, and can directly convert electricity into light. LED lighting fixtures comprising LEDs have many advantages such as conservation of energy and protection of the environment, long service life, absence of stroboflash, being able to work under low voltage as well as being safe and reliable, and are therefore being quickly promoted and made popular. Currently, the LED illuminating lamp generally comprises the LED lamp panel and the drive power source for powering the LED lamp panel, the LED lamp panel comprises one lamp panel attached with LED packages, and the drive power source comprises an LED drive plate soldered with components. Because the lamp panel needs to have good heat radiation property, the base plate thereof often uses the aluminum base plate to facilitate connection with the radiator and bring into being good heat radiation effects. Because the LED drive plate needs to be soldered with electronic components, it needs to be made by using the existing PCB board, so that the lead-out pins of electronic components can go through the pin holes of the PCB board and be soldered to the PCB board. For example, an "LED illuminating lamp" disclosed in the patent literature of China with the publication number CN102997102A comprises a lamp holder extending in the longitudinal direction, a lamp shade covering the said lamp holder, a lamp panel with some light emitting diodes supported on the said lamp holder, end caps set on the two ends of the said the lamp holder in the longitudinal direction, and the drive power source set inside the said end caps, and between the lamp panel on at least one end of the said LED illuminating lamp and the drive power source is set a light guide plate at an angle to the said lamp panel. The LED illuminating lamp reflects some light through the light guide plate, which is further transmitted through the lamp shade area above the drive power source, so that the light emitting area is enlarged. However, the existing LED illuminating lamp has the following defects: because its lamp panel and LED drive plate are made separately, the lamp panel and the LED drive plate need to be connected through conducting wires or connection terminals, which results in complicated production process, waste of manpower, and further increase in manufacturing cost, and makes the connection of the lamp panel and the LED drive plate poor in consistency and reliability.

BRIEF SUMMARY OF THE INVENTION

Exemplary advantages of various embodiments of the present invention include resolving an issue with the circuit board of the existing LED illuminating lamp in that its lamp panel and LED drive plate involve complicated production process, waste of manpower, and further increase in manufacturing cost, and make the connection of the lamp panel and the LED drive plate poor in consistency and reliability, and providing a composite LED circuit board and the manufacturing method, which can significantly simplify the connection between the lamp panel and the LED drive plate, as the connection between the two is good in consistency and high in reliability, which is thus favorable for saving manpower and reducing manufacturing cost. Additional advantages will become apparent in view of the following disclosure.

To achieve the above and still other advantages, various embodiments of the present invention provide an LED module; an LED bulb, lamp, lighting fixture or the like incorporating one or more LED modules; and methods for manufacturing an LED module and/or an LED bulb, lamp, or lighting fixture comprising one or more LED modules.

According to one aspect of the present invention, an LED module is provided. The LED module comprises a circuit board; a peripheral metal board abutting and about the circuit board; an electrical insulation layer on the circuit board and the peripheral metal board; electrical traces disposed on the electrical insulation layer; and one or more LEDs operationally mounted on the electrical traces and the electrical insulation layer over the peripheral metal board.

According to another aspect of the present invention, an LED module is provided. In one embodiment the LED module comprises a circuit board having a first surface and a peripheral metal board abutting and about the circuit board. The LED module further comprises an electrical insulation layer on the first surface of the circuit board and on the peripheral metal board. The LED module further comprises electrical traces on the electrical insulation layer and one or more LEDs mounted on the electrical traces and the electrical insulation layer and over the peripheral metal board.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION OF THE INVENTION

Figure 1:
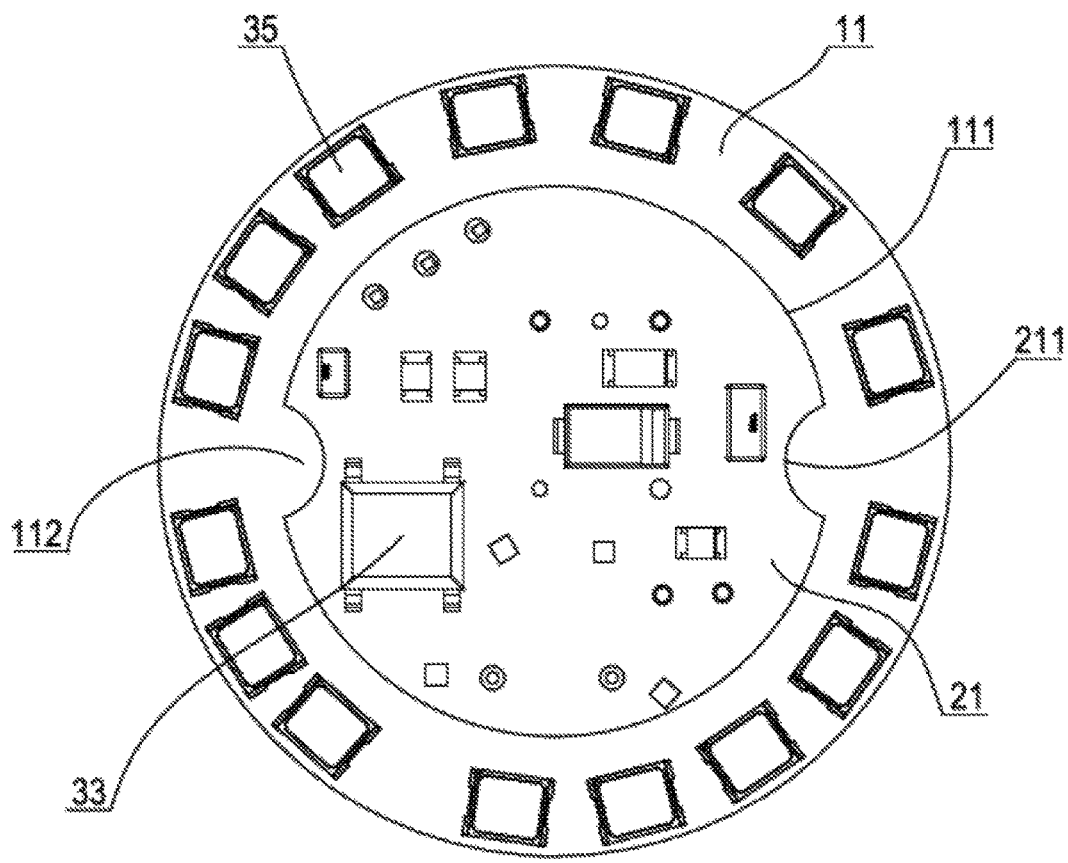
FIG. 1 is a structural representation of an LED module, in accordance with various embodiments of the present invention.

Various embodiments of the present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

A light emitting diode (LED) is a semiconductor that emits light when an electrical current is applied to it. Typically, one or more LED chips or die are arranged, mounted, and/or electrically connected into an LED package to facilitate use for an application. An LED package generally comprises electrical connections. In example embodiments, an LED package may comprise phosphor to convert the color of the light emitted by the LED and/or optical components (e.g., primary optics). Other possible arrangements, mounting configurations, and/or electrically connections of LEDs may be possible such as on leads with a cup embedded in an epoxy shape or directly on a circuit board. As used herein, "LED package" is intended to cover the full range of possible arrangements, mounting configurations, and electrical connections of LEDs that may be utilized in accordance with the present invention.

As mentioned, an exemplary advantage or purpose of the various embodiments of the present invention is to resolve the issue with the circuit board of the existing LED illuminating lamp in that its lamp panel and LED drive plate involve a complicated production process, waste of manpower, and further increase in manufacturing cost, and make the connection of the lamp panel and the LED drive plate poor in consistency and reliability, and to provide a composite LED circuit board and the manufacturing method, which can significantly simplify the connection between the lamp panel and the LED drive plate, and the connection between the two is good in consistency and high in reliability, which is thus favorable for saving manpower and reducing manufacturing cost.

General Discussion of LED Circuit Board and Associated Manufacturing Method

To implement the above purpose and exemplary advantage, various embodiments of the present invention provide a composite LED circuit board (e.g., an LED module), comprising an aluminum base plate (e.g., a peripheral metal board), and the aluminum base plate is set with an embedding hole, inside the embedding hole an insulating base plate (e.g., a circuit board) is embedded flush with the surface of the aluminum base plate to form a composite base plate, the surface of the composite base plate is set in turn from the inside to the outside with an electrical insulating layer and a conductive copper foil (e.g., traces) on the electrical insulating layer for purpose of electric conduction to form a composite PCB board, the composite PCB board is set with a drive power source component at a site corresponding to the insulating base plate to bring into being a drive plate, the composite PCB board is set with LED packages at a site corresponding to the aluminum base plate to bring into being a lamp panel, and the lamp panel and the drive plate are connected through the conductive copper foil in between.

With regard to the composite LED circuit board, the aluminum base plate is embedded with an insulating base plate to bring into being a composite base plate, an insulating layer and a conductive copper foil are then set at the outer side of the composite base plate, so that the original aluminum base plate can be made into a lamp panel, while the insulating base plate can be made into a drive plate, the circuits between its lamp panel and drive plate can be connected through the conductive copper foil, which meets the different requirements of the lamp panel and the drive plate on base plate materials on the one hand to make the lamp panel have good heat radiation properties, and at the same time, significantly simplifies the connection structure between the lamp panel and the LED drive plate, so that it is favorable for saving manpower and reducing manufacturing cost, and the connection between the two is consistent and reliable.

In certain embodiments, the composite PCB board is respectively set on the upper and lower surfaces of the composite base plate with an insulating layer and a conductive copper foil, and the LED packages and the drive power source component are respectively set on the upper and lower surfaces of the composite PCB board.

Because the LED packages and the drive power source component are respectively set on the upper and lower surfaces of the composite PCB board, it is favorable for deployment of the drive power source component on the drive plate to avoid interference brought into being between the LED packages and the drive power source component.

In certain embodiments, the outer edge of the aluminum base plate is circular, the embedding hole is a circle coaxial with the outer edge of the aluminum base plate, so that the aluminum base plate is in a shape of a circular ring (e.g., annulus), and the LED packages are set around the surface of the aluminum base plate of circular shape.

The aluminum base plate of circular shape makes the LED packages set around the surface of the aluminum base plate of circular shape, so that it is favorable for bringing into being uniform light emitting of the light source, leads to increased uniformity in heat radiation of the lamp panel, and at the same time, facilitates embedding of the insulating base plate into the embedding hole of the aluminum base plate.

In certain embodiments, the edge of the said embedding hole is set with semi-circular protrusions, and the said insulating base plate is set with semi-circular notches at the edge to be adapted to the semi-circular protrusions.

The semi-circular notches of the insulating base plate engage with the semi-circular protrusions of the aluminum base plate, which enables accurate positioning between the insulating base plate and the aluminum base plate on the one hand, and at the same time, is favorable for increasing the engagement force between the insulating base plate and the aluminum base plate to enhance the strength of the composite base plate.

The manufacturing method for a composite LED circuit board, comprising the following steps:

a. A punching die is used to die stamp some aluminum base plates in a rectangular array with internal embedding holes on an aluminum sheet, the outer edges of two adjacent aluminum base plates are connected through connection strips, insulating base plates adapted to the embedding holes in outer shape are obtained through die stamping, and the thickness of the insulating base plate is consistent with the thickness of the aluminum base plate;

b. Insulating base plates are respectively embedded into the embedding hole of each of the aluminum base plates, so that the upper and lower surfaces of the insulating base plate are flush with the upper and lower surfaces of the aluminum base plate, the aluminum base plate and the internal insulating base plate thereof form a composite base plate, and all the interconnected composite base plates form the base plate component;

c. A layer of insulating semi-dry adhesive is uniformly coated on the surface of the aluminum sheet where the base plate component is die stamped, and the semi-dry adhesive is covered with a whole sheet of copper foil;

d. Constant pressure is applied to the surface of the copper foil, which is baked at a temperature of 130°-180° for 45-60 minutes, so that the semi-dry adhesive is cured into an insulating layer;

e. Etching treatment is performed on the copper foil on the surface of the base plate component according to the circuit diagram, so that a conductive copper foil for purpose of electric conduction (e.g., traces) is formed where it corresponds to each of the composite base plates;

f. Connection strips that connect each of the composite base plates are cut off, so that some composite PCB boards formed by the composite base plates with the surface insulating layer and the conductive copper foil are obtained;

g. A drive power source component is set on the composite PCB board at a site corresponding to the insulating base plate to make them bring into being a drive plate, some LED packages are set on the composite PCB board at a site corresponding to the aluminum base plate to bring into being a lamp panel, and at this time, the conductive copper foil on the insulating plate brings into being a drive circuit, the conductive copper foil on the aluminum base plate brings into being a lamp panel circuit, so that the lamp panel and the drive plate are connected through the conductive copper foil in between.

Because various aluminum base plates are also connected with tiny connection strips in between at the time of die stamping on the aluminum sheet, the aluminum base plates are connected as a whole at this time, so that it facilitates subsequent coating of semi-dry adhesive and covering of a whole sheet of copper foil, which can greatly enhance production efficiency, and ensures a flat and smooth surface of the composite base plate after coating of semi-dry adhesive to be favorable for electrical connection between the lamp panel and the drive plate through the conductive copper foil. Semi-dry adhesive is also called thermosetting adhesive, which can be used to bond the copper foil and the composite base plate on the one hand, and at the same time, naturally forms an insulating layer after drying and curing.

In certain embodiments, the punching die comprises an upper die and a lower die, the upper die comprises an upper die holder, a punch fixed to the upper die holder and a sliding bar, the punch comprises a punch main body used to form the embedding hole of the aluminum base plate, the lower surface of the punch main body is higher than the lower surface of other parts of the punch, the lower die comprises a lower die holder and an elevation die plate, the lower die holder is set with a lower die plate, an elastic component is set between the lower die plate and the lower die holder, the lower die plate is set with a primary punch die hole adapted to the punch, the elevation die plate is set with a secondary punch die hole adapted to the punch main body, the height difference between the punch main body and other parts of the punch is equal to the sum of the thicknesses of the elevation die plate and the aluminum base plate, the lower part of the upper die holder is also set with a stripper, the stripper is set with a punch lead hole adapted to the punch, the stripper may be suspended on the sliding bar of the upper die holder in a sliding way so as to form a sliding connection with the upper die holder, and an elastic component is set between the stripper and the upper die holder;

When die stamping the aluminum sheet, the aluminum sheet is first positioned on the lower die, the upper die then moves downward, the stripper of the upper die first presses the aluminum sheet, the elastic component between the stripper and the upper die holder is compressed, the punch extends out of the punch lead hole to work with the primary punch die hole of the lower die plate to die stamp aluminum base plates interconnected with connection strips on the aluminum sheet, the punch main body knocks out the embedding hole on the aluminum base plate, and the lower die plate also moves downward under pressure at this time;

After that, the upper die moves upward to return to the original position, the elastic component between the stripper and the upper die holder makes the stripper and the upper die holder separate, the punch retracts again into the punch lead hole of the stripper, the die-stamped aluminum sheet stays on the lower die, and the lower die plate moves upward to return to the original position;

Then, the die-stamped aluminum sheet is covered with the elevation die plate, a laminated base plate of the same thickness of the aluminum sheet is placed on the elevation die plate, the upper die is then made to move downward again, the stripper of the upper die first presses the laminated base plate, the punch extends out of the punch lead hole, the punch main body in the punch works with the secondary punch die hole of the elevation die plate to die stamp a mutually separated insulating base plate on the laminated base plate, the insulating base plate continues to move downward under the drive of the punch main body and is exactly embedded into the embedding hole corresponding to the aluminum base plate at the lower part to form the composite base plate;

At this time, the stripper is flush with other parts of the punch, and other parts of the punch push the lower die plate and the composite base plate to move downward under pressure at the same time through the laminated base plate, the elevation die plate and the die-stamped aluminum sheet;

Finally, the upper die moves upward again to return to the original position, the stripper is separated from the upper die holder, the punch retracts again into the punch lead hole of the stripper, and the die-stamped laminated base plate stays on the lower die, so that the base plate component formed through interconnection of composite base plates by connection strips is obtained.

The aluminum base plate and the insulating base plate of various embodiments of the present invention are formed through die stamping on the same punching die, which can therefore ensure that the insulating base plate and the embedding hole of the aluminum base plate are consistent in size to enhance the fitting accuracy of the insulating base plate and the embedding hole. In particular, the punch of the present invention is a stepped structure, and there is only the secondary punch die hole working with the punch main body on the elevation die plate used to die stamp the insulating base plate, therefore, when die stamping the laminated base plate, only the punch main body inside the punch plays a role while other parts of the punch do not play a role, the punch main body and the secondary punch die hole work together to die stamp the insulating base plate adapted to the embedding hole. Because the height difference between the punch main body and other parts of the punch is equal to the sum of the thicknesses of the elevation die plate and the aluminum base plate, when the punch is die stamping the laminated base plate, the punch main body enters the secondary punch die hole of the elevation die plate to die stamp the insulating base plate on the laminated base plate, and when other parts of the punch abut on the laminated base plate to make relative displacement no longer exist between the punch and the laminated base plate, the lower end of the punch main body is exactly flush with the lower surface of the elevation die plate, and the die-stamped insulating base plate goes exactly into the embedding hole of the aluminum base plate under the elevation die plate. In other words, with regard to the insulating base plate of the present invention, not only can multiple pieces be completed at one time through die stamping process, but the embedding of the insulating base plate with the embedding hole of the aluminum base plate is completed as well at the same time of forming through die stamping, so that production efficiency can be greatly enhanced.

In certain embodiments, a bar lead hole adapted to the sliding bar is set on the stripper, the lower end of the sliding bar is set with a hook to hook and hang the stripper, so that the stripper is suspended at the hook of the sliding bar, and at this time, the lower end of the punch is located inside the punch lead hole.

The stripper is suspended at the hook of the sliding bar, so that the sliding bar not only plays the role of a guide bar, but also plays the role of a gag lever post at the same time, which is favorable for simplification of structure.

In certain embodiments, a guide post is set at the edge angle of the lower die holder, and the lower die plate, the elevation die plate, the stripper and the upper die holder are respectively set with a guide sleeve adapted to the guide post.

The lower die plate, the elevation die plate, the stripper and the upper die holder are guided and positioned through the common guide post, which can ensure the positioning accuracy thereof and is favorable for simplification of structure.

According to various embodiments, at Step a, locating holes are also punched at the diagonal positions of the said aluminum sheet, and at Step d, some aluminum sheets bonded with copper foils through semi-dry adhesive are stacked up on a bearing platform in a sealed drying room first, the locating holes of the aluminum sheets are set as sleeves on the locating post of the bearing platform, resilient sleeper bearings made of high temperature-resistant silica gel are also laid between adjacent aluminum sheets and under the bottom-layer aluminum sheet, the top-layer aluminum sheet is covered on the top with a flexible fluid bag filled inside with liquid and in flat shape, and the flexible fluid bag is set on the top with a pressure unit to apply constant pressure to the aluminum sheet.

The setting of locating holes at the diagonal positions of the aluminum sheets is favorable for accurate alignment when aluminum sheets are stacked up on the bearing platform. When the pressure unit applies pressure on the flexible fluid bag, the flexible fluid bag can transmit uniformly and consistently the pressure applied by the pressure unit to the top layer of the stacked aluminum sheets, while the resilient sleeper bearing can uniformly transmit the pressure to the surface of the copper foil of each layer of aluminum sheet, which avoids the unfavorable impact of tiny protuberances and impurities between two layers of aluminum sheets and ensures reliable bonding and curing of the copper foil on the surface of aluminum sheet.

Therefore, various embodiments of the present invention have the following exemplary and non-limiting beneficial effects: they can significantly simplify the connection between the lamp panel and the LED drive plate, and the connection between the two is consistent and reliable, which is thus favorable for saving manpower and reducing manufacturing cost.

Exemplary LED Module

Figure 2:
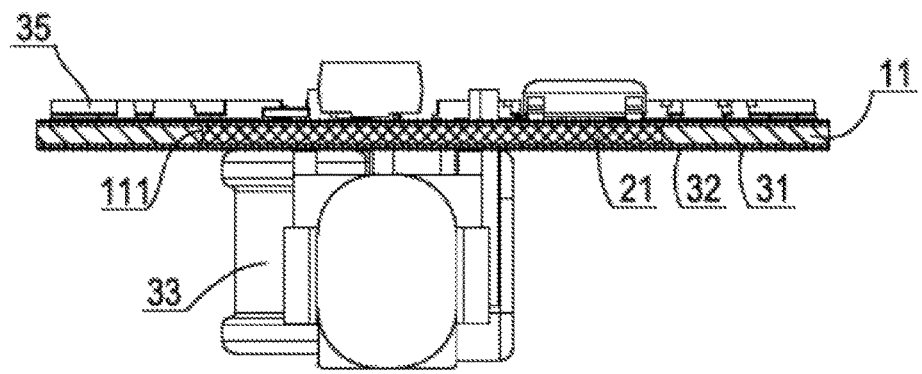
FIG. 2 is a sectional view of the LED module shown in FIG. 1.

As shown in FIG. 1 and FIG. 2, a composite LED circuit board or LED module is provided comprising the aluminum base plate 11. In various embodiments, the thickness of the aluminum base plate is 0.8-1.5 mm. The aluminum base plate is set with the embedding hole 111. The insulating base plate 21 is embedded inside the embedding hole. In various embodiments, the shape of the insulating base plate 21 matches the outer shape of the embedding hole such that the insulating base plate 21 may be embedded into the embedding hole to form the composite base plate. In various embodiments, the insulating base plate is made through die stamping of the laminated base plate such as FR-1 that is generally used to make PCB boards. The corresponding surface of the aluminum base plate 11 is flush with the corresponding surface of the insulating base plate 21.

In various embodiments, the insulating layer 31 and the conductive copper foil 32 for purpose of electric conduction are set on the flush surface of the composite base plate in turn from the inside to the outside to form the composite PCB board. The composite PCB board is set with one or more drive power source component 33 at a site corresponding to the insulating base plate to bring into being a drive plate in the LED lighting device on the composite PCB board. The conductive copper foil on the insulating base plate brings into being the drive plate circuit. The composite PCB board is set with the LED packages 35 at a site corresponding to the aluminum base plate to bring into being a lamp panel in the LED lighting device on the composite PCB board, so that the lamp panel has good heat radiation properties. Accordingly, the conductive copper foil on the lamp panel brings into being the lamp panel circuit, and the lamp panel and the drive plate are connected through the conductive copper foil in between, which thus significantly simplifies the connection structure between the lamp panel and the drive plate in the LED lighting device, is favorable for saving manpower and reducing manufacturing cost, and makes the connection between the two consistent and reliable. To make the illumination of the LED lighting device more uniform, the aluminum base plate can be circular, while the embedding hole is a circular hole coaxial with the circular aluminum base plate, so that the aluminum base plate is in a shape of a circular ring, and the LED packages are set around the surface of the aluminum base plate of circular shape.

In various embodiments, the thickness of the laminated base plate is 0.8-1.5 mm, while the thickness of the aluminum base plate can be the same as the thickness of the insulating base plate, so that the upper and lower surfaces of the aluminum base plate are flush with the corresponding upper and lower surfaces of the insulating base plate. The insulating layer and the conductive copper foil respectively are disposed on the upper and lower surfaces of the composite base plate, while the LED packages and the drive power source component are respectively set on the upper and lower surfaces of the composite PCB board, so as to facilitate the deployment of the composite LED circuit board and avoid interference brought into being between the LED packages and the drive power source component. For example, one or more drive power source components may be mounted on the lower surface of the insulating base plate, one or more other drive source components may be mounted on the upper surface of the insulating base plate, and/or one or more LED packages may be mounted on the upper surface of the aluminum base plate. In addition, we can also set two semi-circular protrusions 112 symmetrically on the edge of the embedding hole, and the insulating base plate is set on the edge with semi-circular notches 211 adapted to the semi-circular protrusions. When the insulating base plate is embedded into the embedding hole of the aluminum base plate, the semi-circular notches of the insulating base plate engage with the semi-circular protrusions of the aluminum base plate, which enables accurate positioning between the insulating base plate and the aluminum base plate on the one hand, and at the same time, is favorable for increasing the engagement force between the insulating base plate and the aluminum base plate to enhance the strength of the composite base plate.

Exemplary Method for Manufacturing an LED Module

Figure 3:
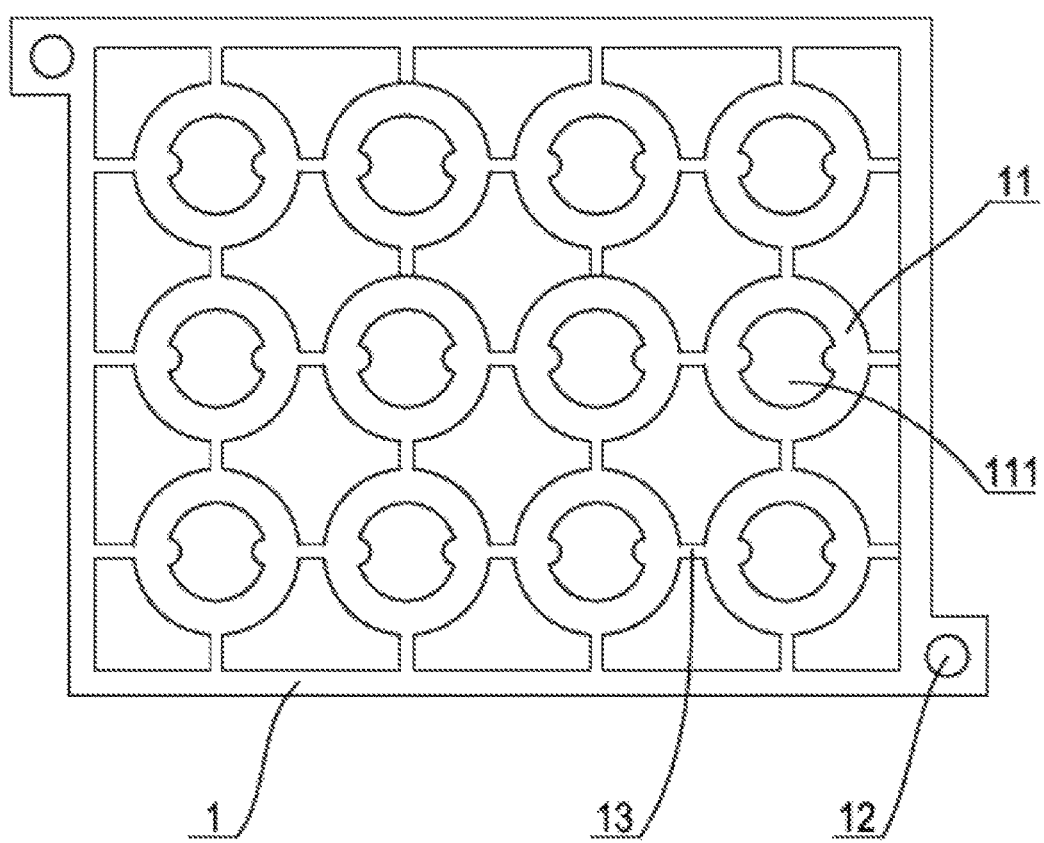
FIG. 3 is a structural diagram of the aluminum sheet for die stamping an aluminum base plate, in accordance with various embodiments of the present invention.
Figure 4:
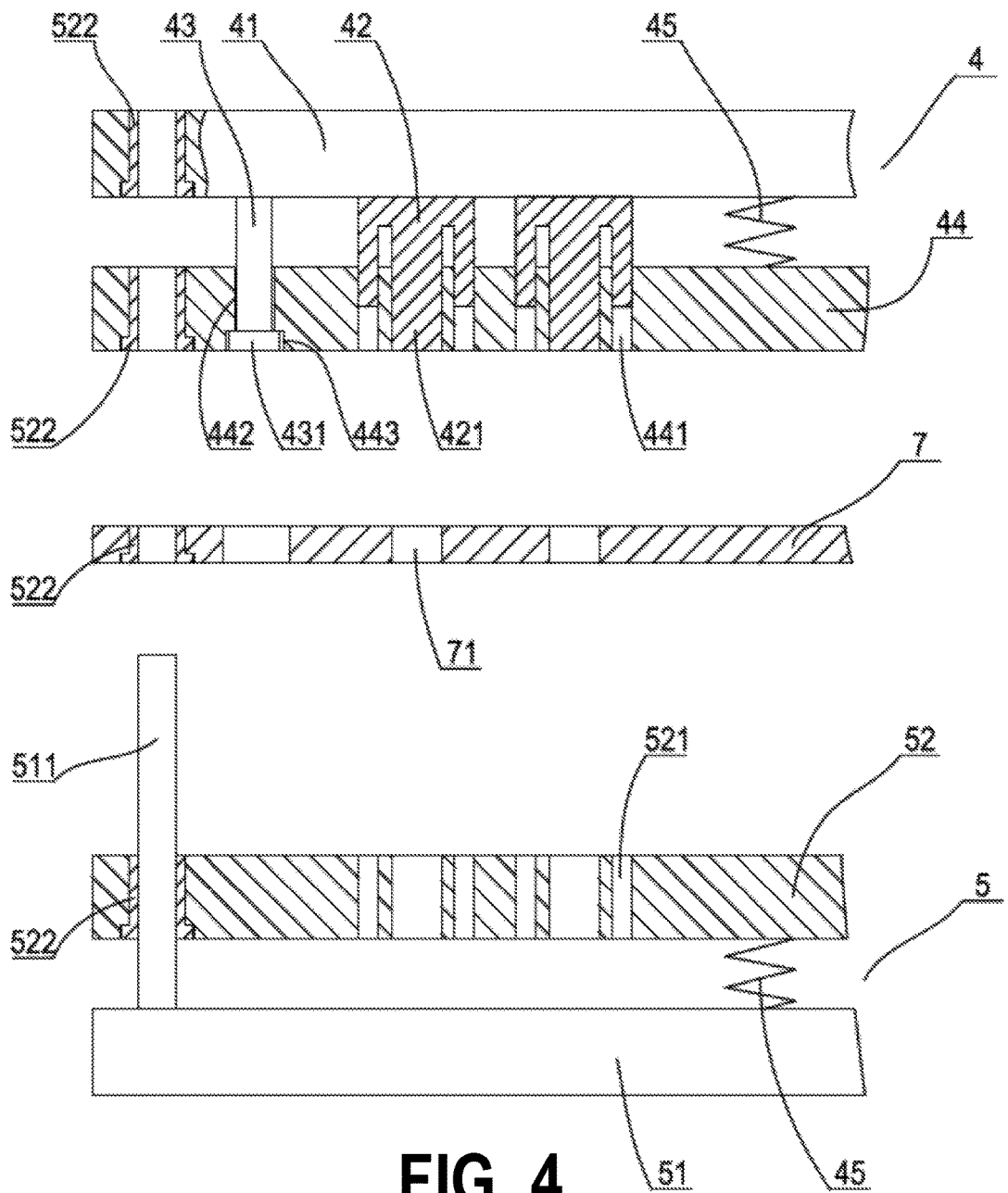
FIG. 4 is a structural representation of the punching die that may be used in accordance with various embodiments of the present invention.

An exemplary method for manufacturing a composite LED circuit board or LED module will now be described, as comprising the following steps:

a. As shown in FIG. 3, in various embodiments, a punching die is used to die stamp some aluminum base plates 11 of circular shape in rectangular array on an aluminum sheet 1 with thickness of 0.8-1.5 mm, inside the aluminum base plate is the embedding hole 111, the outer edges of two adjacent aluminum base plates are connected through the connection strips 13 with width of 0.5-1 mm, and an insulating base plate adapted to the embedding hole in outer shape and of thickness equal to that of the aluminum base plate is obtained by way of die stamping on the laminated base plate. To facilitate subsequent processing of the aluminum sheet, locating holes 12 may also be die stamped at the diagonal positions of the aluminum sheet at the same time when aluminum base plates are die stamped on the aluminum sheet;

b. Insulating base plates are respectively embedded into the embedding hole of each of the aluminum base plates, so that the upper and lower surfaces of the insulating base plate are flush with the corresponding upper and lower surfaces of the aluminum base plate, and the aluminum base plate and the internal insulating base plate thereof form a composite base plate. At this time, all the interconnected composite base plates on the whole aluminum sheet form the base plate component. As shown in FIG. 4, in various embodiments, the punching die comprises the upper die 4 and the lower die 5, the upper die comprises the upper die holder 41 connected to the press, the punch 42 fixed to the upper die holder and the cylindrical sliding bar 43, the punch comprises the punch main body 421 used to form the embedding hole of the aluminum base plate, and the lower surface of the punch main body is higher than the lower surface of other parts of the punch. The lower part of the upper die holder is also set with the stripper 44, and the stripper is set with the punch lead hole 441 adapted to the punch to form a sliding connection with the punch. The stripper also needs to be set with the bar lead hole 442 adapted to the vertical sliding bar, so that the stripper can move up and down under the guide of the sliding bar. In addition, the lower end of the sliding bar is set with a protruding ring to form the hook 431 that can hook and hang the stripper, and the elastic component 45 is set between the stripper and the upper die holder, so that the stripper is suspended at the hook of the lower end of the sliding bar, and at this time, the lower end of the punch is located inside the punch lead hole. The counterbore 443 may be set at the lower end of the bar lead hole of the stripper, so that the position of the hook of the sliding bar can be limited to inside the counterbore. The lower die of the punching die comprises the lower die holder 51 connected to the press and the lower die plate 52 set on the lower die holder, and the lower die plate is set with the primary punch die hole 521 adapted to the punch. The vertically upward guide post 511 is set at the edge angle of the lower die holder, and the guide sleeve 522 adapted to the guide post is then respectively set on the lower die plate, the stripper and the upper die holder, so that the upper die holder, the stripper, the lower die plate and the lower die holder can be accurately positioned together through the guide post. Additionally, an elastic component may be set between the lower die plate and the lower die holder. A pressure spring or resilient block made of polyurethane are examples of the elastic component that may be set between the stripper and the upper die holder as well as between the lower die plate and the lower die holder. In addition, in various embodiments, the punching die further comprises an elevation die plate 7, the elevation die plate is set with the secondary punch die hole 71 adapted to the punch main body, and the edge angle of the elevation die plate is set with the guide sleeve adapted to the guide post.

When die stamping the aluminum sheet, the aluminum sheet is first positioned on the lower die, the press is then started to make the upper die move downward, the stripper of the upper die first presses the aluminum sheet, the elastic component between the stripper and the upper die holder is compressed, the punch extends out of the punch lead hole to work with the primary punch die hole of the lower die plate to die stamp aluminum base plates interconnected with connection strips on the aluminum sheet, the punch main body knocks out the embedding hole on the aluminum base plate, and the lower die plate also moves downward under pressure at this time;

After that, the upper die moves upward to return to the original position, the elastic component between the stripper and the upper die holder makes the stripper continue its tight attachment to the lower die plate to make the stripper and the upper die holder separate, and at this time, the punch retracts again into the punch lead hole of the stripper, the die-stamped aluminum sheet stays on the lower die, and with the continued upward movement of the upper die, the slide bar makes the stripper move upward synchronously and mutually separate from the die-stamped aluminum sheet, and the lower die plate moves upward to return to the original position.

Figure 5:
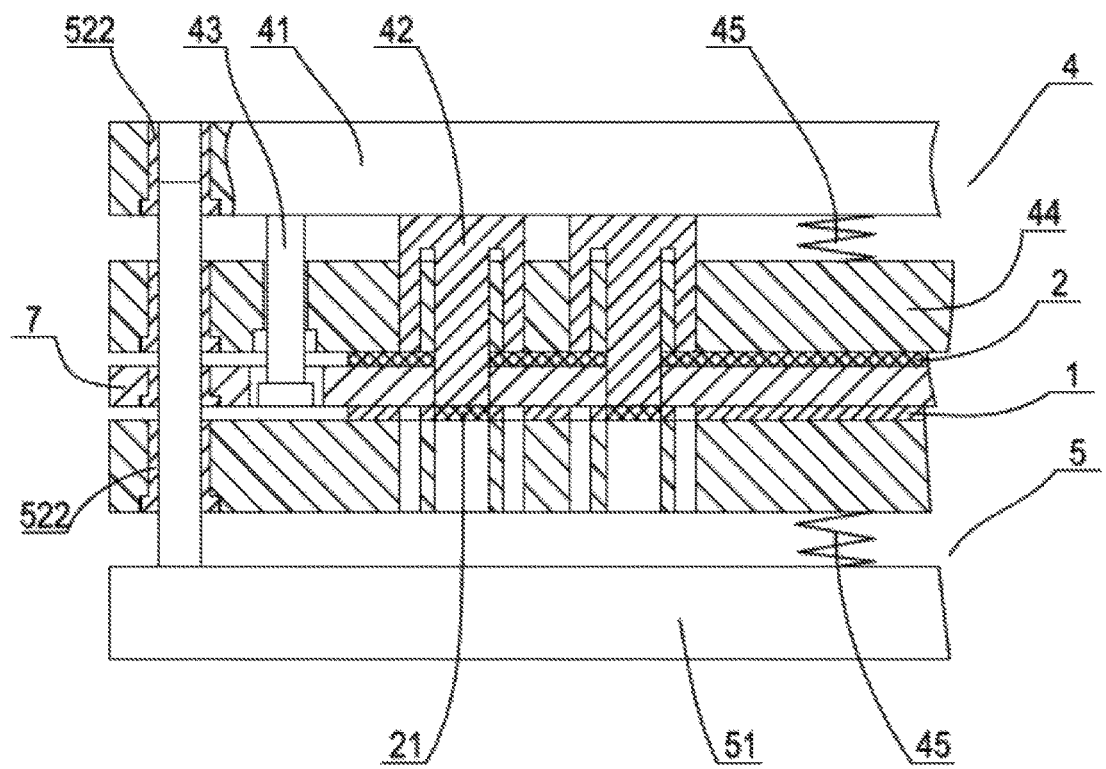
FIG. 5 is a schematic diagram of the state when the punching die performs die stamping of the insulating base plate, in accordance with various embodiments of the present invention.

Then, as shown in FIG. 5, the die-stamped aluminum sheet is covered with the elevation die plate, and at this time, the guide sleeve of the elevation die plate covers the guide post of the lower die holder, so that the secondary punch die hole of the elevation die plate is accurately positioned with the punch main body above and the embedding hole of the aluminum base plate below. Then, the laminated base plate 2 of the same thickness of the aluminum sheet is placed on the elevation die plate, the press is started again to make the upper die move downward, the stripper of the upper die first presses the laminated base plate, the punch extends out of the punch lead hole, the punch main body in the punch works with the secondary punch die hole of the elevation die plate to die stamp a mutually separated insulating base plate 21 on the laminated base plate, the insulating base plate continues to move downward under the drive of the punch main body and is exactly embedded into the embedding hole corresponding to the aluminum base plate at the lower part to form the composite base plate. Understandably, the height difference between the punch main body and other parts of the punch is equal to the sum of the thicknesses of the elevation die plate and the aluminum base plate, which thus makes sure that the insulating base plate embedded into the embedding hole of the aluminum base plate is exactly flush with the upper and lower surfaces of the aluminum base plate.

At this time, other parts of the punch abut on the laminated base plate, so as to push the lower die plate to move downward under pressure through the stacked laminated base plate, elevation die plate and die-stamped aluminum sheet, the composite base plate inside the primary punch die hole of the lower die plate moves downward synchronously, and accordingly, the stripper of the lower die plate also abuts on the laminated base plate so as to be flush with other parts of the punch.

Figure 6:
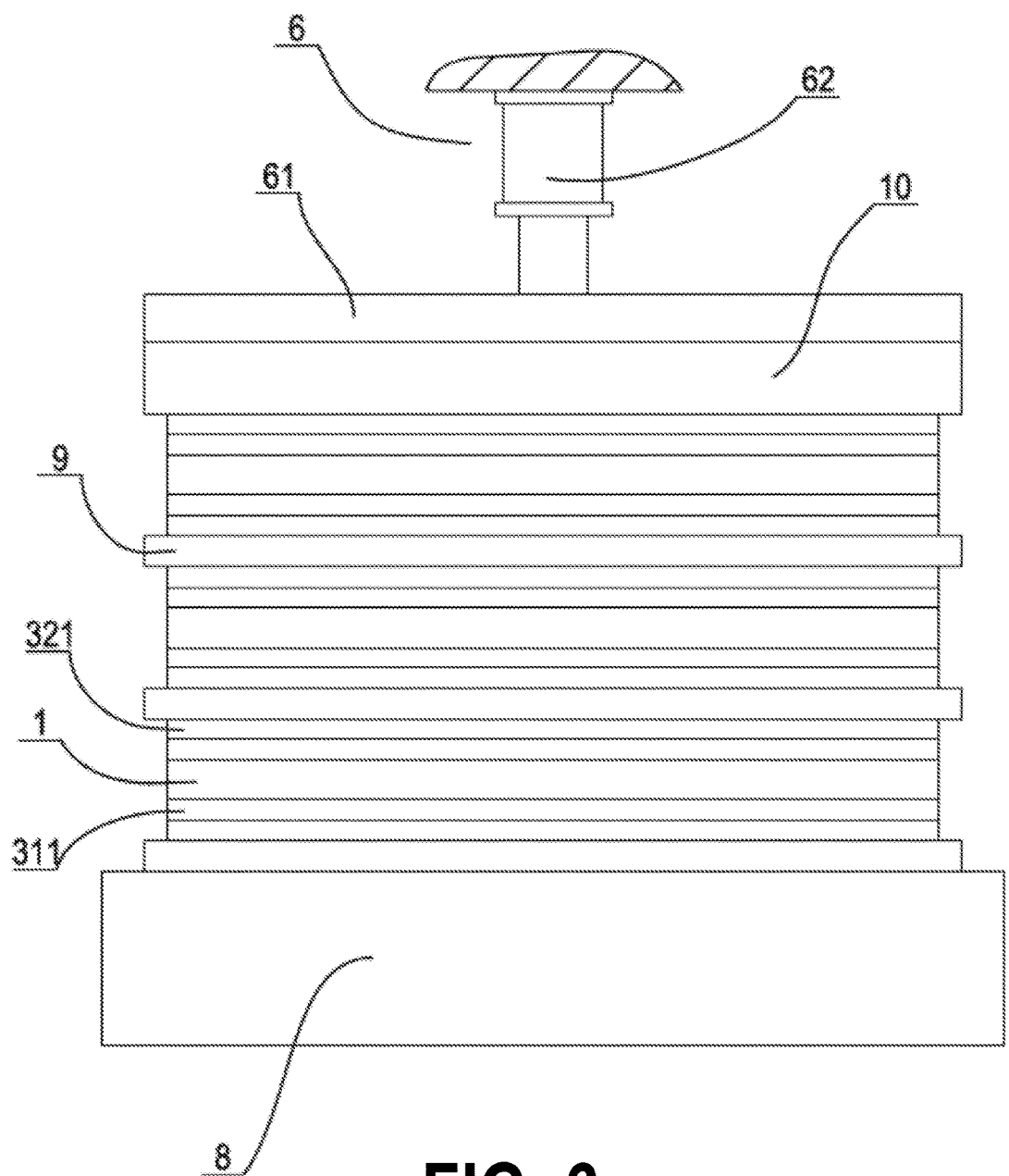
FIG. 6 is a schematic diagram of a state when the aluminum sheet is bonded with copper foil and is being dried, in accordance with various embodiments of the present invention.

Finally, the upper die moves upward again to return to the original position, the stripper is separated from the upper die holder, the punch retracts again into the punch lead hole of the stripper, and the die-stamped laminated base plate stays on the lower die, so that the base plate component formed through interconnection of composite base plates by connection strips is obtained.

c. A layer of insulating semi-dry adhesive is uniformly coated on both the upper and lower surfaces of the aluminum sheet. For example, a layer of insulating D3451 semi-dry adhesive is uniformly coated on the upper and lower surfaces of the aluminum sheet where the base plate component is die stamped, and the semi-dry adhesive is attached with a whole sheet of copper foil.

d. Constant pressure is applied to the surface of the copper foil, which is baked at a temperature of 130°-180° for 45-60 minutes, so that the semi-dry adhesive is cured and forms an insulating layer. For example, as shown in FIG. 6, a plurality of aluminum sheets 1 bonded with the copper foil 321 through the semi-dry adhesive 311 may be stacked on a bearing platform 8 in a sealed drying room, the bearing platform is set with the locating post corresponding to the locating hole of the aluminum sheet, and in this way, the locating hole of the aluminum sheet is set as a sleeve on the locating post of the bearing platform, so that accurate positioning can be kept for each layer of the aluminum sheets in between. The resilient sleeper bearings 9 made of high temperature-resistant silica gel may be laid between adjacent aluminum sheets, the thickness of the resilient sleeper bearing may be 1-1.5 mm, and a layer of resilient sleeper bearing may also be laid under the bottom-layer aluminum sheet, the top-layer aluminum sheet is then covered on the top with the flexible fluid bag 10 filled inside with liquid, the flexible fluid bag is in flat and rectangular shape, and the size of the flexible fluid bag should be able to cover a whole sheet of copper foil. In addition, the flexible fluid bag is set on the top with the pressure unit 6, the pressure unit comprises the pressure plate 61 covering the flexible fluid bag as well as the oil cylinder 62 above the pressure plate, and the vertically downward piston rod of the oil cylinder is connected to the pressure plate. In this way, when the oil cylinder works, the piston rod can apply a pressure to the flexible fluid bag through the pressure applied, the fluid in the flexible fluid bag can transmit uniformly and consistently the pressure applied by the pressure unit to the top layer of the stacked aluminum sheets, so as to avoid inconsistency of pressure at various places of the aluminum sheets resulting from tiny errors of parallelism between the pressure plate and the top-layer aluminum sheet. When tiny protuberances and impurities exist between two layers of aluminum sheets, because protuberances and impurities will be trapped in the resilient sleeper bearing, the resilient sleeper bearing may thus ensure that pressure can be uniformly and consistently transmitted between two layers of aluminum sheets, so as to apply a constant pressure on each layer of aluminum sheets and ensure that the copper foil can be reliably bonded to the aluminum sheet through semi-dry adhesive.

e. Etching treatment is performed on the copper foil on the surface of the base plate component according to the circuit diagram, so that a conductive copper foil for purpose of electric conduction is formed where it corresponds to each of the composite base plates. For example, an etching treatment may be performed on the copper foil to create traces for the drive circuit and the lamp panel circuit.

f. Connection strips that connect each of the composite base plates are cut off, so that individual composite PCB boards formed by the composite base plates with the surface insulating layer and the conductive copper foil are obtained. Because the cross section of the connection strip is relatively small, in some embodiments, the composite base plates may be manually twisted off, and all the connection strips on the whole sheet of base plate component can be cut off at one time by way of die stamping, so that production efficiency can be greatly enhanced.

g. One or more drive power source components are set on the composite PCB board at a site corresponding to the insulating base plate to make them bring into being a drive plate. For example, one or more driver power source components may be disposed on traces on the insulating base plate to provide a drive plate. One or more LED packages are set on the composite PCB board at a site corresponding to the aluminum base plate to bring into being a lamp panel. For example, one or more LED packages may be set on traces on the aluminum base plate to provide a lamp panel. The conductive copper foil on the insulating plate brings into being a drive circuit, the conductive copper foil on the aluminum base plate brings into being a lamp panel circuit, so that the lamp panel and the drive plate are connected through the conductive copper foil in between.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A light emitting diode (LED) module comprising:
a circuit board having a first surface;
a peripheral metal board comprising an embedding hole, the circuit board embedded within the embedding hole;
an electrical insulation layer on the first surface of said circuit board and on said peripheral metal board;
electrical traces on said electrical insulation layer; and
one or more LEDs operatively mounted to said electrical traces and said electrical insulation layer and over said peripheral metal board.

2. The LED module according to claim 1, further comprising at least one driver circuit component mounted to said circuit board.

3. The LED module according to claim 2, further comprising at least one driver circuit component mounted to at least one of said first surface of said circuit board or a second surface of said circuit board, said second surface being opposite said first surface.

4. The LED module according to claim 2 wherein the at least one driver circuit component comprises at least two driver circuit components, wherein a first driver circuit component of the at least two driver circuit components is mounted to the first surface of said circuit board, and wherein a second driver circuit component of the at least two driver circuit components is mounted to the second surface of said circuit board.

5. The LED module according to claim 1, wherein said circuit board is a multi-layered circuit board having a metal core.

6. The LED module according to claim 5, wherein said peripheral metal board is in thermal communication with said metal core.

7. The LED module according to claim 1, wherein said one or more LEDs are in thermal communication with said peripheral metal board.

8. The LED module according to claim 1 wherein said electrical traces are thermally conductive.

9. The LED module according to claim 1 wherein said peripheral metal board is configured to be thermally conductive to at least one of a heat sink or a heat dissipation structure of a lighting device incorporating the LED module.

10. The LED module according to claim 1 wherein said peripheral metal board is approximately the same thickness as said circuit board.

11. The LED module according to claim 10 wherein said peripheral metal board and said circuit board are both between 0.8 and 1.5 mm thick.

12. The LED module according to claim 1 wherein said circuit board is generally circular in shape and said peripheral metal board is generally annular in shape.

13. The LED module according to claim 12 wherein an outer edge of said circuit board defines a first circle and an outer edge of said peripheral metal board defines a second circle and wherein said first circle and said second circle are concentric.

14. The LED module according to claim 1 wherein said circuit board is configured to be oriented perpendicular to the axis of a lighting device incorporating the LED module.

15. The LED module according to claim 1 wherein said circuit board is a double-sided circuit board.

16. The LED module according to claim 1 wherein said peripheral metal board is secured about said circuit board by adhesive.

17. The LED module according to claim 16 wherein the adhesive is said electrical insulation layer.

18. The LED module according to claim 1 wherein said circuit board is press-fitted into an embedding hole of the peripheral metal board.

19. The LED module according to claim 1 wherein a circuit is formed on said circuit board after said circuit board is embedded in an embedding hole of the peripheral metal board.

20. The LED module according to claim 1 wherein the circuit board is embedded within the embedding hole such that the first surface is flush with a corresponding surface of the peripheral metal board.

* * * * *